United States Patent [19]

Roveti

[11] 3,916,220

[45] Oct. 28, 1975

[54] CURRENT CONTROL ELECTRONIC SWITCH

[76] Inventor: Denes Roveti, 15 Lincoln Park Center, Annapolis, Md. 20401

[22] Filed: Apr. 2, 1974

[21] Appl. No.: 457,372

[52] U.S. Cl. ................ 307/251; 307/237; 307/304; 328/171; 330/145

[51] Int. Cl.² ................... H03K 17/60; H03K 3/353

[58] Field of Search ........... 307/237, 255, 251, 288, 307/304; 328/169, 171; 330/145, 164

[56] References Cited

UNITED STATES PATENTS

| | | | |
|---|---|---|---|
| 3,333,180 | 7/1967 | Neu | 307/304 X |
| 3,369,129 | 2/1968 | Wolterman | 307/304 X |
| 3,521,087 | 7/1970 | Lombardi | 307/251 X |
| 3,603,811 | 9/1971 | Day et al. | 307/237 |
| 3,605,728 | 9/1971 | Ogle | 307/237 X |
| 3,631,264 | 12/1971 | Morgan | 328/169 X |
| 3,760,284 | 9/1973 | Matejka | 328/171 X |

*Primary Examiner*—John S. Heyman
*Assistant Examiner*—L. N. Anagnos

[57] ABSTRACT

A current control electronic switch is presented to satisfy many needs in present technology. The switch of this invention, in its simplest form, is a unipolar or direct current operating device which includes two field effect transistors connected together in a regenerative circuit. As the current flow through the circuit increases, the voltage drop across portions of the circuit also increases until one of the transistors senses an overload condition and rapidly reduces the current flowing through its main conduction path. As the current flowing through the circuit decreases toward an open circuit, the voltage of the source is applied directly across the entire switch and the regenerative mode of the circuit causes the second transistor to trigger, or snap, into its high impedance condition. Neither of the transistors open the switch fully — there is always a small trickle current flowing through it until it is reset. Some of the embodiments disclosed use four field effect transistors and some use three. In addition, the use of both manual and automatically opening, momentary opening switches to interrupt the total current flowing through the circuit for resetting the switch are described. The use of diodes to improve snap actions are also shown.

12 Claims, 11 Drawing Figures

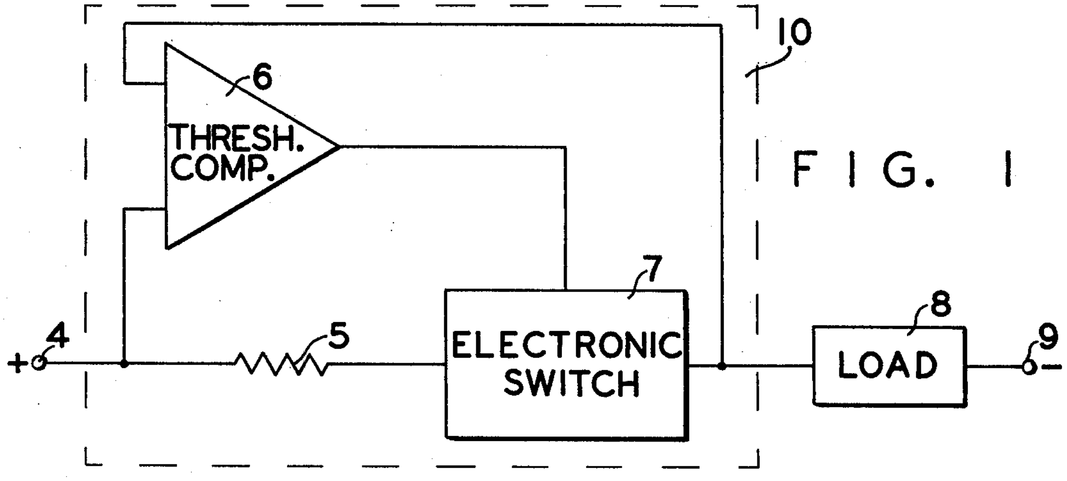
FIG. 1
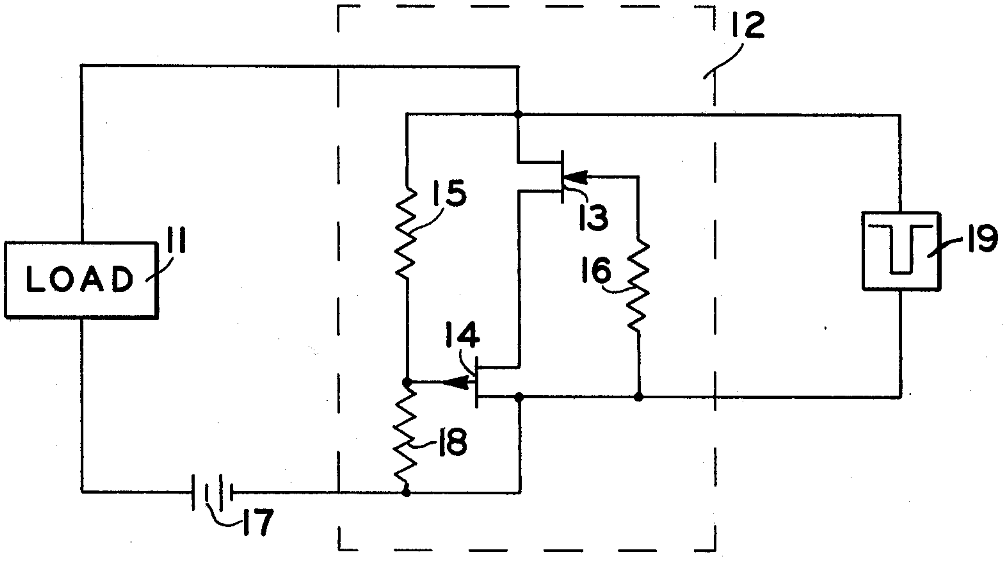
FIG. 2
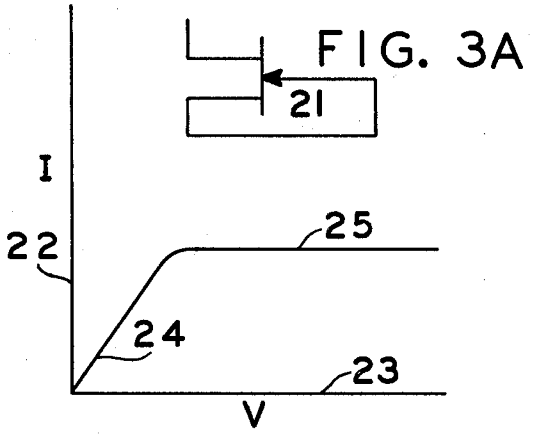
FIG. 3A
FIG. 3
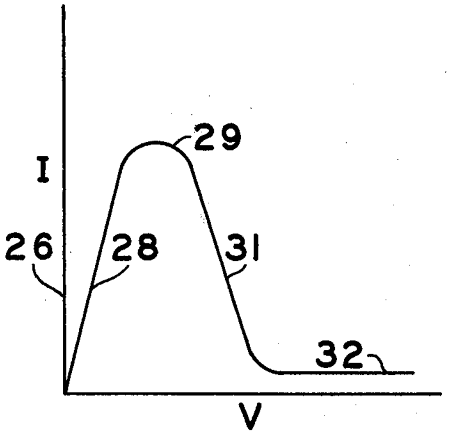
FIG. 4

CURRENT CONTROL ELECTRONIC SWITCH

BACKGROUND OF THE INVENTION

1. Field of the Invention

Switching is one of the most fundamental functions of semi-conductors, and one of the goals of semiconductor design engineers is to economically produce a switch whose performance in the closest to the ideal. There are four possible control alternatives in semiconductor switches from which components may be chosen. These are the normally-closed switch which is voltage-controlled to open, the normally-closed switch which is current-controlled to open, the normally-open switch which is voltage-controlled to close, and the normally-open switch which is current-controlled to close. The normally-open switches are not new and these are illustrated by thyratrons, silicon control rectifiers and similar devices. Of the normally-open voltage-controlled switches, one of the most efficient is the regenerative or breakdown type which is commonly used for solid state switching. This type inludes four-layer (or Shockley) type diodes, three-layer trigger type diodes, and other breakdown diode types. One of their common characteristics is a rapid change-of-state which can be brought about by a positive feed back once a prescribed voltage is exceeded. These devices are similar to the thyristor in their voltage-current characteristics. Normally-open current-control solid state devices are rather rare and not commonly used.

Devices, called gates, which require several different voltages applied to different terminals are often used for triggering of signals whose voltages are lower than those required to operate the diode types. Devices of this type are generally high impedance types and are normally in their high impedance state. A first or conditioning signal is applied and, then, when the trigger voltage is applied (and this is usually the highest non-destructive voltage which the device will accept), the device breaks down or changes to its low impedance state. It then remains latched in its on state for so long a time as sufficient holding current is provided.

SUMMARY OF THE INVENTION

A normally-closed current-controlled switch is not new. The normally-closed current-controlled switch of this invention in its two-terminal embodiment has typical bidirectional transfer characteristics. The switch is normally in its low impedance state and represents a low resistance. When the current through the switch reaches a value sufficient to cause switching, the switch transfers to its high impedance state. During the transition, any increase in voltage normally results in a decrease in current flowing through it, since the device is then in its negative resistance region. The negative resistance results in a regenerative feedback between the two transistors which comprise a switching couple providing the system with a very high rate of response.

It is an object of this invention to provide a new and improved electronic device.

It is another object of this invention to provide a new and improved electronic switching device.

It is still another object of this invention to provide an electronic switching device which is normally closed.

It is yet a further object of this invention to provide an electronic switching device which is normally closed and which is responsive to an excessive flow of current therethrough to reach its open condition.

Other objects and advantages of this invention will become more apparent as the following description proceeds, which description should be considered together with the accompanying drawings.

BRIEF DESCRIPTION OF THE DRAWINGS

FIG. 1 is a block diagram of the basic switch of this invention;

FIG. 2 is a schematic circuit diagram of one embodiment of this invention;

FIG. 3 is a curve which represents the voltage-current characteristic of the individual transistors of the circuit of FIG. 2;

FIG. 4 is a curve which represents the voltage-current characteristics of the switch of FIG. 2;

DESCRIPTION OF PREFERRED EMBODIMENTS

Figure 5:
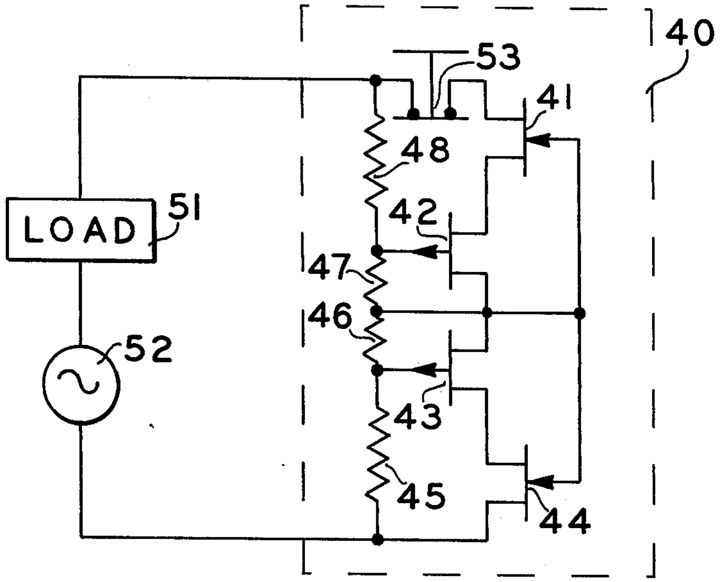
FIG. 5 is a schematic wiring diagram of a bi-polar device according to this invention.

Referring now to the drawings in detail and, more particularly to FIG. 1, the reference character 4 designates a terminal adapted to be connected to a source of positive potential, to one end of a current sensing resistor 5, and to one input of a threshold comparator 6. The other side of the resistor 5 is connected to one input to an electronic switch 7, and the output of the threshold comparator 6 is connected to a control input of the switch 7. The output of the electronic switch 7 is connected to one side of a load 8, the other side of which is connected to a terminal 9 which is adapted to be connected to a source of negative potential. The output of the electronic switch 7 is also applied to another input of the threshold comparator 6.

The overall circuit 10 is a device which senses the amount of current flowing through the resistor 5 and operates the electronic switch 7 when that current exceeds a prescribed amount. The threshold comparator 6 receives two inputs, one from the positive end of the resistor 5 and the other from the output of the electronic switch 7. As the current flowing through the resistor 5 increases, the voltage drop across the entire circuit 10 increases, and the difference between the two voltages applied to the threshold comparator 6 increases. As this difference in voltage reaches a predetermined point, the threshold comparator 6 applies an output signal to the switch 7 causing that switch to open and cut-off the flow of current to the load 8.

One embodiment of the invention is shown in schematic circuit form in FIG. 2. A load 11 and a switch 12 are connected in series across a source of electrical energy represented by the battery 17. The switch 12 comprises a pair of field effect transistors (FETs) 13 and 14. The source electrode of the transistor 13 is connected to one side of the load 11, and the drain electrode of the transistor 13 is connected to the source electrode of the transistor 14. The drain electrode of the transistor 14 is connected to the negative side of the battery 17, to the gate electrode of the transistor 14 through a biasing resistor 18, and to one side of a sensing resistor 15, the other side of which is connected to the junction of the load 11 and the source electrode of the transistor 13. The gate electrode of the transistor 13 is connected through a resistor 16 to the negative side of the battery 17. A source of negative pulses 18 is connected across the two transistors 13 and 14.

In operation, current flowing from the battery 17 through the load 11 also flows through the main conductive paths of the transistors 13 and 14 which are normally conductive and of low impedance. As the current through the circuit rises, the voltage drop across the transistor 13 and across the resistor 15 also rises. This voltage drop is sensed by the gate electrode of the transistor 14 and, when the threshold voltage is reached, the transistor 14 begins pinching off the current. As the current flow through the transistor 14 decreases, the voltage drop across the transistor 14 increases, and this voltage is fed back through the resistor 16 to the gate electrode of the transistor 13, causing that transistor to open up rapidly. The resistor 16 is part of a positive feedback path of the circuit and is provided to prevent the entire circuit from going into oscillation. It serves as a damping resistor. Although the transistors 13 and 14 have opened, current still flows through the resistor 15, and the voltage drop provided across the circuit is sufficient to keep the switch 12 in its high impedance state. In order to reset the circuit, a negative pulse is applied from the source 19 across the transistors 13 and 14. This opposes the voltage drop across the entire switch 12. When the pulse from the source 18 decays, the entire switch circuit 12 has been reset and is again in condition to carry the current flowing through the load 11. Should the overload condition persist, then the circuit repeats this entire operation.

FIG. 3 shows a representative curve of the transfer functions of a field effect transistor when it is connected as shown in FIG. 3A. The field effect transistor 21 in FIG. 3A has its gate electrode connected to its drain electrode. In this configuration, the curve of its transfer function has two parts — 24 and 25 as shown. The first portion 24 of the curve shows voltage rising linearly with increases in current. This can be called the ohmic or resistive portion of the transistor operation. At a particular current level which depends upon the physical characteristics of the transistor, the transfer function curves into a knee, and the voltage thereafter rises with constant current flow. This is the saturation portion of the curve and represents the negative resistance operation of the transistor.

FIG. 4 represents the transfer characteristics of the switch 12 of FIG. 2. The vertical axis 26 denotes current and the horizontal axis 27 represents voltage. The initial portion of the curve 28 again represents a pure resistance with the voltage increasing linearly with increases in current flow. This continues until a peak 29 is reached. Thereafter, the voltage across the switch 12 increases as the current flow decreases, as shown in the negative resistance portion of the curve designated 31. When the switch opens, the residual current flowing through the circuit is represented by the portion of the curve 32 which represents a constant current flowing even though the voltage may continue to increase. It is this transfer characteristic which enables the device shown in FIG. 2 to serve so well as a rapid operating switch or circuit breaker. This apparatus also can operate as a memory since it remains in its open condition with the residual current 32 flowing until the circuit itself is reset by some means which is exemplified in FIG. 2 by the pulse from the source 18.

The transfer characteristic of the switch 12 of FIG. 2 is due, in part, to the use of a positive or P transistor 13 used with a negative or N transistor 14. This combination of the two transistors of opposite types with the gate electrode of one sensing the voltage changes across the other produces a very fast operating switch. The interconnection of the two transistors 13 and 14 constitutes a positive feedback circuit which amplifies the response of the transistor 14 and feeds that response back to drive transistor 13 into a very rapid response. The transistor 14 is a low impedance transistor which has a relatively low reverse impedance. On the other hand, the transistor 13 is a high impedance transistor which can withstand high reverse potentials. Transistor 13 responds relatively slowly; transistor 14 responds relatively rapidly. When an overload occurs, transistor 14 senses it and responds rapidly to pinch off the current flowing through it. The response of transistor 14 is amplified and fed back to cause a more rapid response in transistor 13. Before transistor 14 terminates the conduction through the switch and has been subjected to the entire reverse voltage of the source 17, transistor 13 has been driven into cut-off and it carries most of the reverse voltage.

The device shown in FIG. 2 is a uni-polar device suitable for use in direct current circuits. A bi-polar device suitable for use with alternating current is shown in FIG. 5. The switch 40 is connected in series between a load 51 and a source of alternating energy 52. The switch 40 comprises four field effect transistors 41, 42, 43 and 44. One side of the load 51 is connected to one side of a normally closed push-button switch 53, the other side of which is connected to the source electrode of the FET 41. The drain electrode of the FET 41 is directly connected to the source electrode of the FET 42, whose drain electrode is directly connected to the source electrode of the FET 43. Similarly, the drain electrode of the FET 43 is directly connected to the source electrode of a FET 44 whose drain electrode is connected to one side of the source of alternating current 52, the other side of which is connected to the other side of the load 51. Also connected across the load 51 and the source of energy 52 is a voltage divider comprising resistors 45, 46, 47 and 48 connected in series. The gate electrode of the FET 43 is connected to the junction of resistors 45 and 46, and the gate electrode of the FET 42 is connected to the junction of the resistors 47 and 48. The junction of resistors 46 and 47 is connected to the junction of the drain electrode of FET 42 and the source electrode of FET 43 and also directly to the gate electrodes of the two FETS 41 and 44.

Essentially, the switch 40 shown in FIG. 5 comprises two cross-connected switches 12 as shown in FIG. 2 so that the switch 40 responds to current flowing in both directions. As the current from the source 52 flows through the load 51, it also passes through the switch 40. This current passes through the main conduction path of the four FETs 41–44 which are connected in series. As the current flow through the load increases, the current flowing through the voltage divider circuit of resistors 45–48 and through the FETs 41–44 increases. The gate electrodes of the two FETs 42 and 43 sense the increasing voltage produced by the rising voltage drop of the increasing current flow and, when the prescribed value is reached, each of these gate electrodes causes the corresponding FET 42 and 43 to begin opening. As the current flowing through the FET 42 decreases, the gate of the FET 41 senses a higher voltage drop across the FET 42, and the FET 41 begins to open. A similar operation takes place with respect to the FETs 43 and 44. Once the switch becomes open circuited, there is a residual current flowing through the voltage divider 45–48 and through the FETs 41–44. The voltages in the voltage divider are sensed by the gate electrode and prevent the switch 40 from resetting. To accomplish resetting of the switch 40, the push-button switch 53 is provided and this may be depressed momentarily to cut off the flow of current through the FETs 41–44. This permits the FETs to completely reset and to restore current flowing to the load 51 from the source 52. As mentioned above, the push-button switch 53 is but exemplary of the systems which may be used to interrupt the current flow through the switch 40 for resetting purposes. Also, should the overload conditions through the load 51 still exist when the switch 40 is reset, it will immediately open again and continue to recycle in that manner.

Figure 6:
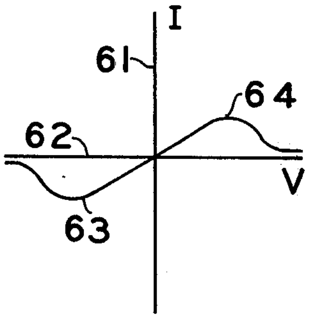
FIG. 6 is a curve which represents the voltage-current characteristics of the bi-polar device of FIG. 5.

The transfer characteristic of the bi-polar circuit of FIG. 5 is shown in FIG. 6. In this case, the two axes 61 and 62 represent current and voltage respectively. The portion 63 of the curve represents the transfer characteristic of the two field effect transistors 43 and 44 and the portion 64 represents the transfer characteristic of the field effect transistors 41 and 42. It should be noted that the portion 63 is essentially the mirror image of a portion 64 symmetrically rotated about the axes 61 and 62. From the curve of FIG. 6, it can be seen that the operation of each of the two halves of the circuit of FIG. 5 is essentially that of the circuit of FIG. 2.

Figure 7:
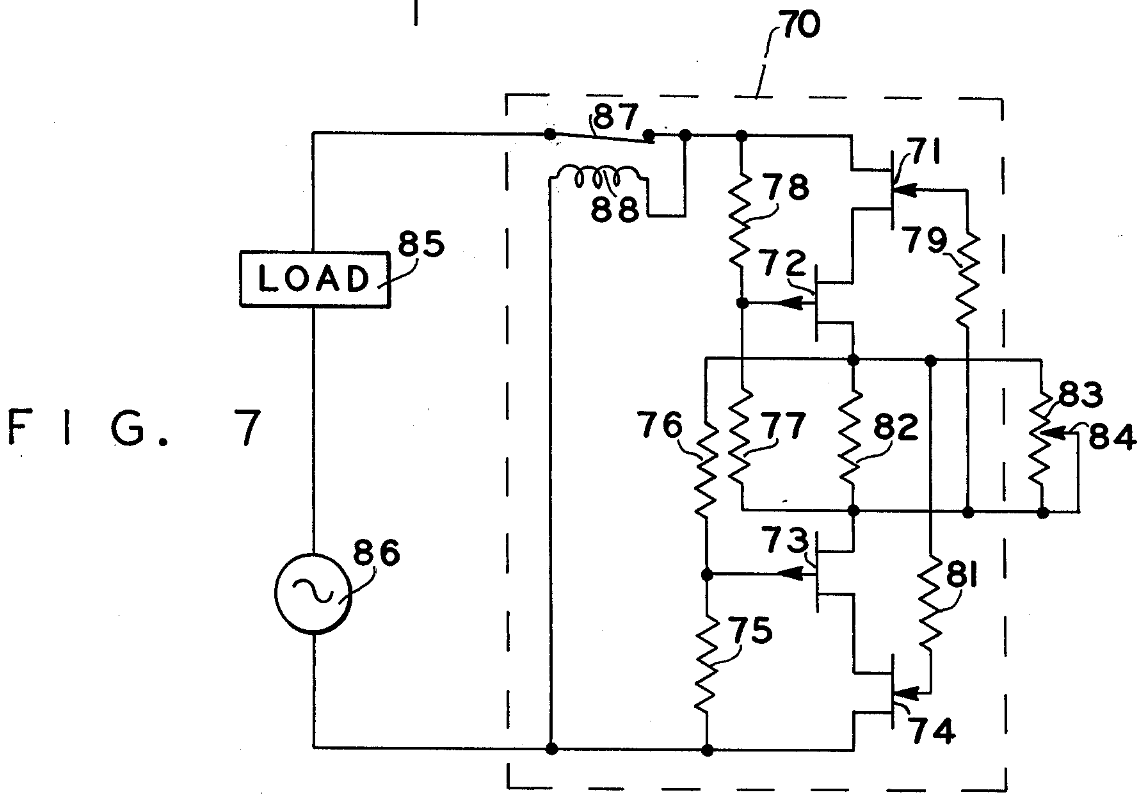
FIG. 7 is a schematic circuit diagram of a programmable bi-polar device according to this invention.

The device of this invention can be made programmable in the sense that the current at which the system opens or operates can be modified at will within limits. The system shown in FIG. 7 is an example of a programmable device of this nature. The switch 70 is connected in series between a load 85 and a source of alternating potential 86. The switch 70 comprises field effect transistors 71, 72, 73 and 74. One side of the load 85 is connected through a relay switch 87 to the source electrode of the FET 71. The drain electrode of the FET 71 is connected to the source electrode of a FET 72, whose drain electrode is connected through a resistor 82 to the source electrode of FET 73. Similarly, the drain electrode of the FET 73 is connected to the source electrode of the FET 74 whose drain electrode is connected to one side of the source of alternating current 86. The other side of the source 86 is connected to the other side of the load 85. The gate electrode of the FET 72 is connected through a resistor 78 to the source electrode of the FET 71 and through a resistor 77 to the drain electrode of the FET 73. The gate electrode of the FET 73 is connected through a resistor 75 to the drain electrode of the FET 74 and also through a resistor 76 to the drain electrode of the FET 72. The gate electrode of the FET 71 is connected through a damping resistor 79 to the source electrode of the FET 73, and the gate of the FET 74 is connected through a damping resistor 81 to the drain electrode of the FET 72. A potentiometer 83 is connected across the resistor 82 with the slide contact 84 connected to one end of the potentiometer itself. Provision can be made to supply a voltage across the potentiometer 83 although no such potential is shown in FIG. 7. A coil 88 is connected across the series arrangement of the load 85 and the source 86 to operate the switch 87.

The current drawn from the source 86 by the load 85 passes through the switch 70. So long as this flow is within specified bounds, nothing happens. However, when the current through the load 85 increases to a point where overload conditions occur, then the current flowing through the FETs 71 and 72 produces an increase in voltage drop across those two transistors. This voltage drop is sensed by the gate electrode of the FET 72 which causes that transistor to begin pinching off the current flow. As the current flowing through the transistor 72 decreases, the voltage applied to the gate electrode of the FET 72 increases, driving that transistor into cut off. The same operation takes place with respect to the transistors 73 and 74 for the other half of the cycle. The gate electrode of the transistor 72 is connected so as to sense the voltage across the resistor 82. Thus, it is the voltage drop across the resistor 82 caused by the current flowing through the series circuit with the transistors 71–74 which is sensed by the gate electrodes of the FETs 72 and 74. The total resistance of this circuit can be controlled by the value of the resistance of the potentiometer 83 which is connected directly in parallel with the resistor 72. Thus, the actual resistance which is being used as a sensing resistance is the parallel arrangement of resistor 82 and the potentiometer 83. By moving the slide 84 along the potentiometer 83, the resistance in the circuit of the potentiometer 83 can be changed, changing the total value of the parallel arrangement of the two resistors. In this manner, the point at which the switch 70 operates can be controlled by the setting of the potentiometer 83. In place of the potentiometer 83, a selectible bias voltage can be applied across the resistor 82. This provides the circuit with a bias potential which may add to or subtract from the voltage drop across resistor 82 to select the point at which an overload occurs. The bias voltage may come from any suitable source such as a digital-to-analog converter fed by a computer output.

When the switch 70 is conductive, the voltage drop across that switch is low and the current flowing through the relay coil 88 is low. When the switch 70 opens due to an overload, and the current flowing through the switch 70 drops to its nominal value, the voltage across the relay coil 88 rises appreciably and operates to open the switch 87. When the switch 87 opens, the current flowing through the relay coil 88 drops to zero and the switch 87 automatically closes. This provides a momentary opening or interruption of the current flowing through the switch 70 to enable the switch 70 to reset itself and again become conductive. The switch 87 is but another example of an automatic interruption means which can be used to reset the electronic switch 70.

Figure 8:
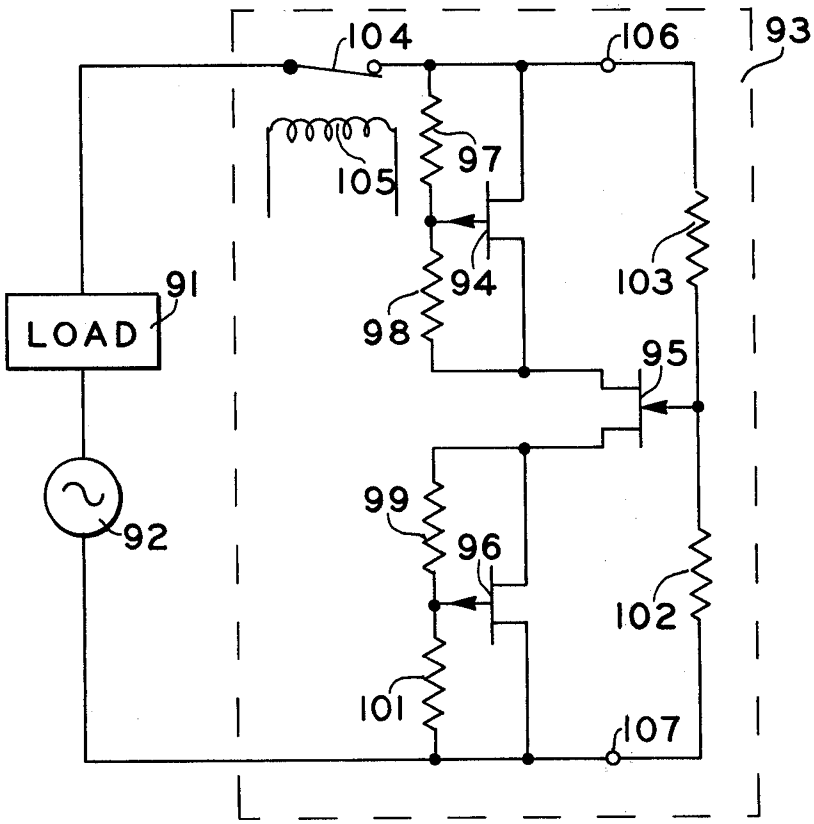
FIG. 8 is another embodiment of a bi-polar device according to this invention.

The bi-polar switches 40 and 70 shown in FIGS. 5 and 7 respectively each use four field effect transistors. A similar circuit is shown in FIG. 8 which uses only three field effect transistors. The switch 93 is connected in series between the load 91 and a source 92 of alternating current. One side of the load 91 is connected through a relay switch 104 to the source electrode of a field effect transistor 94 whose drain electrode is connected to the source electrode of a field effect transistor 95. The drain electrode of the FET 95 is connected to the source electrode of a FET 96 whose drain electrode is connected to one side of the source 92. The other side of the source 92 is connected to the other side of the load 91. The gate electrode of the FET 94 is connected through a resistor 97 to the switch 104 and also through a resistor 98 to the source electrode of the FET 95. The gate electrode of the FET 96 is connected through a resistor 101 to the one side of the source 92 and through a resistor 99 to the drain electrode of the FET 95. The gate electrode of the FET 95 is connected through a resistor 103 and a terminal 106 to the source electrode of the FET 94 and through a resistor 102 and a terminal 107 to the drain electrode of the FET 96. A relay coil 105, which may be connected in the manner shown in FIG. 7, operates the switch 104.

The operation of the circuit of FIG. 8 is very similar to the operation of the circuit of FIGS. 5 and 7. The switch 93 carries the current flowing from the source 92 through the load 91. When overload conditions exist and the current through the load 91 begins to increase, the gate electrode of the FET 95 senses that increase in current by the voltage drop which appears across the resistors 102 and 103. When the voltage drop across those resistors reaches a prescribed amount, it causes the FET 95 to decrease its conduction toward pinch off. As the current flowing through the series path of the transistors 94–96 decreases, this action is amplified and the voltage which is applied to the two gate electrodes of the FETs 94 and 96 rises to the point where these two transistors open rapidly to open the entire switch 93.

Figure 9:
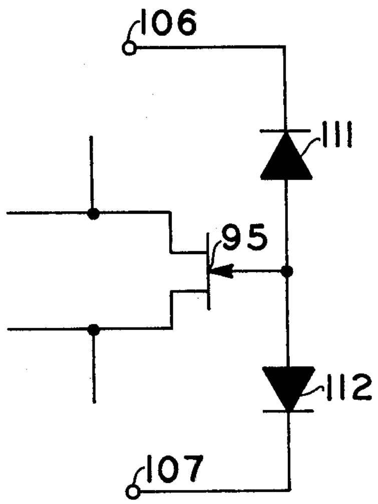
FIG. 9 is a modification of the device of FIG. 8.

The system of FIG. 8, or for that matter the systems of FIGS. 5 and 7 also, are designed as bi-polar circuits to operate with alternating current. When an overload occurs, the conduction through the switching circuit drops, following the amplitude of the decreasing sinusoidal curve of the current. To obtain a snap action or a more rapid cut off of steeper wave front — a circuit such as that shown in FIG. 9 has been designed. The circuit of FIG. 9 shows only a portion of the circuit of FIG. 8 and shows that portion connected to the terminals 106 and 107. The terminal 106 is connected through a diode 111 to the gate electrode of the transistor 95. Similarly, the terminal 107 is connected through a diode 112 to the gate electrode of the transistor 95. When an overload condition in the circuit occurs, this is sensed by the gate electrode of a transistor 95 suddenly, since the voltage applied to the gate rises rapidly as the diodes 111 and 112 become conductive due to the unidirectional conduction of the diodes. It is understood, of course, that these diodes may be used in any of the other alternating current switches shown.

Figure 10:
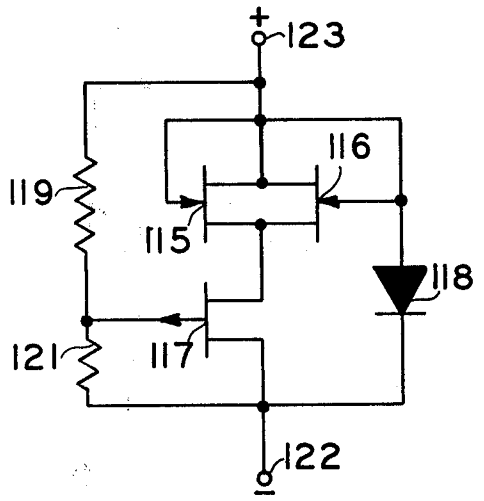
FIG. 10 is a single pole device which is a modification of the device of FIG. 1

Occasionally a uni-polar device of the nature of the circuit of FIG. 2 is required with heavier current carrying capacities. Such a device is shown in FIG. 10. This comprises a pair of field effect transistors 115 and 116, which are connected in parallel to provide parallel paths from the terminal 123 to a terminal 122. The terminal 123 is adapted to be connected to a source of positive potential and the terminal 122 is adapted to be connected to a source of negative potential. This parallel path is in series with the main conductive path of a FET 117. A resistor 119 is connected to the gate electrode of the transistor 117 which is also connected through a resistor 121 to the negative terminal 122. The gate electrodes of the two transistors 115 and 116 are connected together and through a diode 118 to the negative terminal 122 and directly to the positive terminal 123. The operation of the system of FIG. 10 is the same as that of FIG. 2, the only difference between the two being the larger conductive path provided by the parallel transistors 115 and 116.

The above specification has described a new and improved current controlled switch which is rapid in its operation, is adaptable to a wide variety of operating conditions, and is programmable to respond to ranges of operating currents. It is realized that the above disclosure may suggest to others additional ways in which the described invention may be used without departing from its principles. It is, therefore, intended that this invention be limited only by the scope of the appended claims.

What is claimed is:

1. A current responsive, normally closed electrical switch adapted to respond to an overload current through a circuit by interrupting the current flow through that circuit, said switch comprising a first amplifier and a second amplifier, said first amplifier including a first main conduction path and a first control electrode for controlling the current flowing through said first conduction path, said second amplifier including a second main conduction path and a second control electrode for controlling the current flowing through said second conduction path, the current flowing through said first and second main conduction paths being controlled in the same direction by signals of opposite polarities applied to said first and second control electrodes;

means for connecting said first and second conduction paths in series with each other and in series with said circuit to be protected;

impedance means connected across said first and second main conduction paths for developing a voltage drop proportional to the current flowing through said circuit;

means for connecting said second electrode to said impedance means so that when the current flowing through said circuit exceeds a selected amplitude the voltage drop applied to said second control electrode reaches a value sufficient to interrupt the current flowing through said second conduction path;

and a feedback path connected across said second amplifier to feed back to said first control electrode amplified values of the changes in voltage across said second amplifier to rapidly terminate conduction through said first conduction path when the conduction through said second conduction path drops to a second selected value.

2. The switch defined in claim 1 wherein each of said first and second amplifiers comprises a solid state amplifier.

3. The switch defined in claim 2 wherein each of said first and second amplifiers comprises a field effect transistor.

4. The switch defined in claim 1 wherein each of said first and second amplifiers comprises a field effect transistor.

5. The switch defined in claim 1 further including means for selecting the value of load current to which said switch responds.

6. The switch defined in claim 5 wherein said selection means comprises means for varying the value of voltage response developed by said current responsive means.

7. The switch defined in claim 6 wherein said selection means comprises means for applying a bias voltage to said current responsive means.

8. The switch defined in claim 1 further including means responsive to the termination of the current flowing through said first main conduction path for momentarily interrupting the application of load current to said switch.

9. The switch defined in claim 8 wherein said momentary interruption means is manually operated.

10. The switch defined in claim 8 wherein said momentary interruption means is automatically operable.

11. The switch defined in claim 1 further including a unidirectional conductive device connected in said first electrode regeneration connection to provide a clipping action.

12. A current responsive switch comprising a first amplifier having a first main conduction path and a first control means for controlling the current flowing through said first main conduction path, a second amplifier having a second main conduction path and a second control means for controlling the current flowing in said second main conduction path, means for connecting said first and second main conduction paths in series, an impedance connected to carry a current flow which is proportional at any time to the current flowing through said first and second main conduction paths, means for connecting said second control means to said impedance to sense the current flowing through said impedance and to terminate the current flowing through said second main conduction path when said current flow exceeds a prescribed value, and positive feedback means for connecting said first control means to said second amplifier so that the action of said second control means to terminate conduction through said second main conduction path is amplified and applied to said first control means to rapidly terminate conduction through said first main conduction path.

* * * * *